United States Patent [19]

Coleman

[11] Patent Number: 4,729,971

[45] Date of Patent: Mar. 8, 1988

[54] SEMICONDUCTOR WAFER DICING TECHNIQUES

[75] Inventor: Basil Coleman, Branchburg, N.J.

[73] Assignee: Microwave Semiconductor Corporation, Somerset, N.J.

[21] Appl. No.: 33,132

[22] Filed: Mar. 31, 1987

[51] Int. Cl.$^4$ .................. H01L 21/461; H01L 21/463; H01L 21/467

[52] U.S. Cl. .................................... 437/226; 156/645

[58] Field of Search ............... 148/DIG. 51; 156/645; 437/226, 227

[56] References Cited

U.S. PATENT DOCUMENTS 4,159,222  6/1979  Lebow et al. ..................... 156/632
4,266,334  5/1981  Edwards et al. ................... 29/583

OTHER PUBLICATIONS

Iida et al., J. Electrochem. Soc.:Solid State Science, V. 118, No. 5, pp. 768-771 (May 1971).
Tsang et al., Appl. Physics Ltts., V. 28, No. 1 (Jan. 1976), pp. 44-46.
Kuhn-Kuhnenfeld, J. Electrochem. Soc.:Solid State Science, V. 119, No. 8, pp. 1063-1068 (Aug. 1972).

*Primary Examiner*—Olik Chaudhuri
*Attorney, Agent, or Firm*—John Francis Moran

[57] ABSTRACT

A dice separation technique involves producing a depressed street pattern (14) on the front device processing major surface of a wafer (11) before thinning the wafer down to a desired thickness. After mounting the wafer (11) on a suitable carrier, it is thinned down and selectively metallized to from backside contacts. Semiconductor material is removed from the central regions of the streets (14). Exposed material damaged by the material removal is also removed to eliminate microcracking while producing dice (12 and 13) having straight and smooth orthogonal edges. The present technique is particularly suitable for working with brittle compound semiconductor material between die areas having FETs or MMICs embedded therein.

12 Claims, 5 Drawing Figures

SEMICONDUCTOR WAFER DICING TECHNIQUES

BACKGROUND OF THE INVENTION

This invention relates to chip separation techniques, and it relates, more particularly, to the separation of thin wafers such as the type generally using III-V compound semiconductor material.

Thin wafers, typically gallium-arsenide (GaAs) are presently being separated into dice by a number of conventional techniques. Presently, these approaches entail sawing, laser scribing, mechanical scribe and cleave, and chemical etch and cleave.

When thin GaAs wafers are sawed, chipping results along the sawed edges due to the brittleness of GaAs. Even under optimum conditions, smooth orthogonal edges are not produced which makes the handling of the chips more difficult. In addition, micro-cracking can occur during the sawing, which even if it doesn't lower the yield, will tend to decrease device reliability since such cracks are self propagating during stresses attendant through thermal cycling between the transitions of being off and on and vice versa. Although laser scribing of thin compound semiconductor material is able to produce better edges than sawing, it is well known that laser scribing can also generate micro-cracks as a result of the unavoidable localized heating of the crystalline material. This is perhaps best known when laser scribing is used on thin GaAs wafers.

There are numerous problems associated with the conventional separation technique known as scribing and cleaving particularly in thin GaAs wafer material. If the dice, for example, is oriented slightly off the major crystallographic axis, the cleavage lines tend to deviate from the desired separation pattern and may even occur through the active region of the devices lowering the yield. This problem becomes of increasing importance as the wafer diameter increases which is a pervasive trend in practically all semiconductor fabrication processing and materials for obvious reasons well known to those skilled in the device fabrication art. For example, GaAs field effect transistors (GaAs FETs) are usually fabricated with the major surfaces of the wafer corresponding to the (100) crystallographical plane wherein separation into dice having straight edges must be aligned perpendicular to the (110) planes.

The problem associated with the techniques of scribing and cleaving also occur during chemical etching and cleaving in addition to other problems. For example, chemical etching is known to produce undercutting of masked areas and rounding of the bottom of the separation pattern which increases the difficulty in obtaining proper cleaves.

SUMMARY OF THE INVENTION

It is an object to provide a dice separation technique which obviates the problems attendant to conventional dice separation techniques while producing increased yield.

A related object of the new dice separation technique is to provide greater control of the geometry of the dice to facilitate dice handling while reducing the causes of mechanical damage and/or breakage resulting therefrom.

A further object of the present dice separation technique is to remove the location of the physical phenomenon of micro-cracking from the active device region while reducing the causes of its occurrence during the separation process.

The dice separation technique in accordance with the present invention involves patterning or masking the front face corresponding to the active device side of a wafer with a suitable coating. Through the coating mask, exposed portions of the wafer define a street pattern that is etched to predetermined depth. The mask coating is removed. The wafer is then backside processed which may involve such steps as mounting, thinning, and metallization. Next, semiconductor material in the region of the street pattern is removed while accessing the backside of the wafer. Any physical damage in the remaining material from the material removal experienced in the present process in comparison to conventional techniques is transferred from the upper face of the chip to a lower plane removed from the region of the active device area. Ledges resulting from the remaining semiconductor material exposed from the material removal are subsequently etched away chemically to produce device chips with straight edges. As a consequence, the damaged material that is etched produces dice with straight and smooth orthogonal edges.

In some of the further aspects of the invention, the material removal is localized to the central regions of the streets by various alternatives. The material may be removed by mechanical sawing or laser scribing. The present process provides a preferred sequence enabling extremely convenient utilization of known photolithographic process particularly those involving photoresist. In addition, infrared alignment is utilized to register a second patterned mask on the second major surface (wafer backside) to the lanes previously etched into the first major surface of the wafer. The compound semiconductor material comprises gallium arsenide.

BRIEF DESCRIPTION OF THE DRAWING

Features of the invention and additional objects of the invention will be more readily appreciated and better understood by reference to the following detailed description which should be considered in conjunction with the drawing.

DETAILED DESCRIPTION

Figure 1:
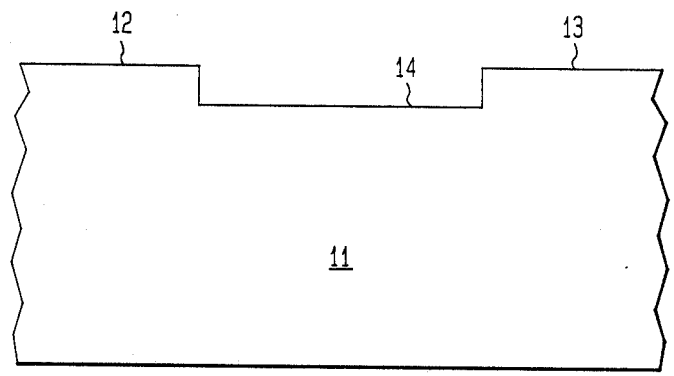
FIG. 1 is a side view of a portion of a semiconductor wafer between two die areas having a device and/or integrated circuitry embedded therein.

Throughout the various drawing figures identical reference numerals serve to identify corresponding elements throughout the description of the dice separation process. It is also to be understood that various elements are not physically proportioned to scale but merely depicted in the interest of clearly illustrating the present dice separation technique.

FIG. 1 is an enlarged side view of a portion of a semiconductor wafer in the region between two die areas 12 and 13. As is typical during device processing, the semiconductor wafer would have a thickness on the order of about twenty mils. or 500 microns in metric units. Each of die areas 12 and 13 has embedded into its first major surface by device and integrated circuit fabrication processing at least one semiconductor device and most likely several semiconductor devices in the form of an integrated circuit.

In accordance with the illustrative application of the principles of the present invention, die areas 12 and 13 represent a plurality of dice occupying essentially the entire first major surface of processed semiconductor wafer of which portion 11 depicts one of a plurality of regions between adjacent dice. In these regions between adjacent dice, the principles of this invention are deployed to obtain separate dice in a manner that improves both the yield of the overall fabrication process including final assembly and the subsequently reliability of the assembled components during operation.

In FIG. 1, a head-on view of a depressed linear region 14 designated as a lane or a street present between die areas 12 and 13. Typically, lanes or streets such as region 14 intersect to form a grid-like pattern surrounding the plurality of dice occupying the surface of the semiconductor wafer. Street or lane 14 is formed by masking die areas 12 and 13 with a patterned protective coating. A suitable protective coating is photoresistive material that is coated over the entire first major surface by spinning and drying. In the case of a negative photoresist, a mask is used to expose areas 12 and 13 to a polymerizing light source while shielding lane 14. Next, the unpolymerized resist is removed before lane 14 is etched. For a positive photoresist lane 14 would be open and the device areas shielded 12 and 13 so that after using a suitable solvent the lane 14 would be unmasked for etching.

It is of principal importance that lane 14 is etched to obtain a predetermined distance into the wafer beyond the plane of the major surface which exceeds the depth of the active junction regions of the devices embedded into wafer 11. Typically, this predetermined distance is at least five microns which was found to be sufficient for gallium arsenide wafer material having GaAs FETs embedded therein. This also applies to monolithic microwave integrated circuits (MMICs) embedded into the die areas. A wet chemical etch having an isotropic characteristic may be used to form lane 14. For example, in the case of GaAs wafer material a suitable wet etching solution is 3:1:1 $H_2SO_4:H_2O_2:H_2O$. Wet etching for four minutes using this solution produced a depth of 14–17 microns. Alternately, street 14 may be reactively ion etched using a chlorine based plasma, for example, $SiCl_4$ to produce a depth in the range of 5–10 microns. The latter etching process produced streets with flatter bottom areas and a more vertical profile for the sidewalls as compared to wet etching.

Figure 2:
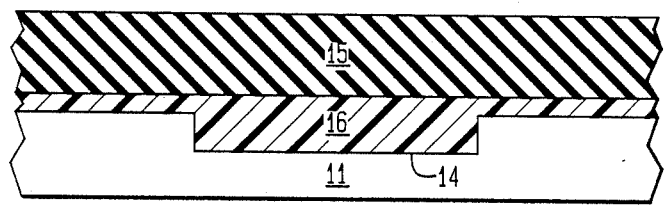
FIG. 2 illustrates the same portion mounted on a carrier disc and thinned to a desired thickness by removing material from the wafer backside.

After the resist is stripped, the wafer is mounted on a carrier disc, for example, sapphire disc 15 depicted in FIG. 2. To bind wafer 11 to disc 15 a wax 16 is used. Wax 16 has a high melting temperature and is chemically inert to etchants used in this process. A suitable wax is polypropolyene applied in such a manner that the minimum thickness of wax 16 between wafer 11 and disc 15 is on the order of five microns.

While on the carrier, wafer 11 is lapped and polished to a thickness within the range of 25–100 microns, typically thirty microns. The advantage of thinning the dice is to improve the heat dissipation characteristic of the chips through a rear contact (subsequently to be fabricated). Next, a street pattern is formed on the back or second major surface of wafer 11. This pattern is aligned with the etched streets on the front using an infrared alignment technique. With the streets areas exposed, a street pattern is etched with $NH_4OH/H_2O_2$ solution of pH7.22 for three minutes to remove approximately 3000A° of semiconductor material. Due to this minor dimension, the presence of the streets on the wafer backside is not shown in the drawing. Again, the photoresist layer is stripped.

Figure 3:
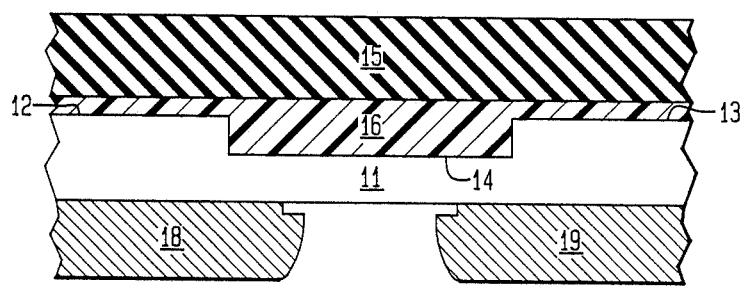
FIG. 3 illustrates the same portion in a subsequent processing stage having backside contacts.

On the dice patterned rear surface, electroless plating is conveniently used to provide an initial layer of palladium that is covered by a gold layer. A separation mask of insulative material is provided to cover the street areas while leaving the dice areas open. A suitable negative resist may be used. The wafer 11 is then electroplated with a permanent contact metal such as gold to dissipate heat when mounted. In FIG. 3, portions of gold contacts 18 and 19 are illustrated each respectively for dice 12 and 13.

Figure 4:
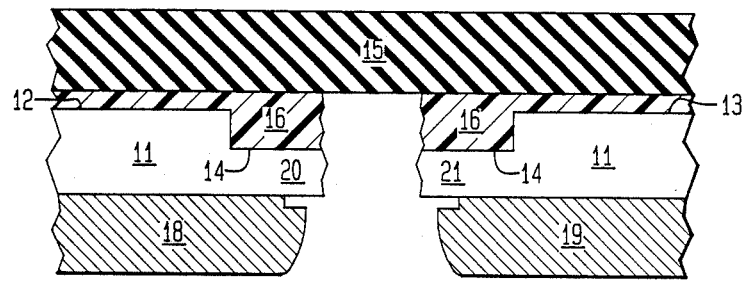
FIG. 4 depicts the same portion after material is removed between the two die areas.

In FIG. 4, semiconductor material is removed from the central region of street 14. This removal may be accomplished using various alternatives. One alternative is to use a saw in which case the width of street 14 should be larger than the width of the saw wheel. Another alternative is to laser scribe. Finally, due to the geometry of the semiconductor material between the dice even mechanical scribing may be used without damaging the chips or dice. In all cases, the material void formed by the presence of street 14 enables a guard ring like build up of wax 16 which serves to protect dice 12 and 13 while material is removed.

Figure 5:
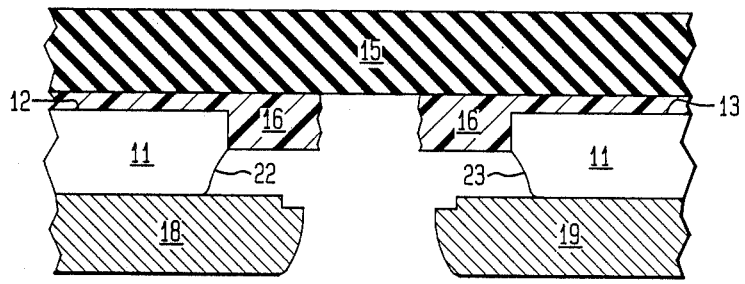
FIG. 5 demonstrates the profile exhibited by the dice while still on the carrier and before demounting.

As may be observed in FIG. 4 ledge shaped regions 20 and 21 are exposed after removal of the semiconductor material from the central portion of steet 14. In accordance with what is known from present practices, ledges 20 and 21, which are immediately adjacent to the removed material, may be mechanically damaged at least to the extent of the occurrence of micro-cracking. However, as previously pointed out ledges 20 and 21 are exposed and may be conveniently etched. A suitable isotropic wet etchant is the solution of $H_2SO_4:H_2O_2:H_2O$ in respective portions of 3:1:1 and produces the sidewall chip profiles 22 and 23 depicted in FIG. 5. As the last step, wax 16 may be dissolved using a degreaser such as trichloroethane. In addition to advantages of the dice or chips having straight and smooth orthogonal geometry, the absence of surface irregularities reduces the likelihood of contamination. This process also increases control of the dice geometry and simplifiers tooling for dice handling during assembly while reducing the possibility of mechanical damage in assembling.

It is to be understood that although the present procedure has been presented largely in the context of GaAs wafer material and circuitry involving GaAs FETs and MMICs, the inventive technique may be used to advantage with different semiconductor materials and circuitry of a different type and different geometrical configurations. Also the etching of a shallow street pattern on the wafer backside before metallization is not germane to the technique illustrative of the invention, but at this point in the process IR alignment techniques are readily used to provide a registration pattern for use after metallization. For example, overall metallization may not be desired particularly in the streets when using laser scribing instead of sawing. However, the overall metallization enables deposition of relatively thick gold by convenient electroplating in selective areas through a mask. This has the advantages of minimizing waste of the precious metal but also removes the gold buildup from possible contact with the saw.

There has thus been shown and described a novel technique for separating semiconductor wafers into dice or individual chips which fulfills all the objects and advantages sought therefor. Many changes, modifications, variations and other uses including different materials and chemical agents and applications of the subject invention will, however, become apparent to those skilled in the art after considering this specification and the accompanying drawing which disclose the preferred methods thereof. All such changes, modifications, variations and other uses and applications which do not depart from the spirit and scope of the invention are deemed to be covered by the invention which is limited only by the claims which follow.

I claim:

1. A method for separating a wafer of III-V compound semiconductor material into dice wherein the wafer has at least some repetitious device geometries embedded into a first of two major surfaces corresponding to dice areas, the method comprising the steps of:
    defining a first patterned mask on the first major surface, the first patterned mask having open areas in the form of lanes generally intersecting conforming to regions between dice geometries and closed areas conforming to the regions occupied by the dice areas;
    etching the lanes to a depth below the plane of the first major surface;
    removing the first patterned mask from the first major surface;
    mounting the wafer on the first major surface so that the second of the two major surfaces is exposed;
    defining a metallized pattern on the second major surface aligned with the dice areas on the first major surface;
    removing semiconductor material from the lanes on the second major surface to form dice from the wafer; and
    etching exposed semiconductor material remaining in the lanes to remove semiconductor material immediately adjacent to the previously removed material.

2. The method of claim 1, wherein the step of defining a first patterned mask includes the steps of:
    coating the first major surface with a photoresist material; exposing the photoresist with a light source through a mask; and removing the photoresist to form the open regions.

3. The method of claim 1, wherein the step of etching comprises wet chemical etching.

4. The method of claim 1, wherein the step of etching comprises reactive ion etching.

5. The method of claim 1, wherein the step of removing semiconductor material comprises sawing the lanes in a path corresponding to their central region.

6. The method of claim 1, wherein the step of removing semiconductor material comprises laser scribing the lanes in a path corresponding to their central region.

7. The method of claim 1, wherein the step of etching semiconductor material remaining in the lanes comprises wet chemical etching with an isotropic etch solution.

8. The method of claim 1, wherein the step of defining a metallized pattern comprises defining a second patterned mask on the second major surface to provide exposed portions aligned with the lanes on the first major surface, etching the exposed portions to form slightly depressed lanes in the second major surface, coating the second major surface with at least one layer of metal, masking the slightly depressed lanes with an insulative coating, and plating exposed portions of the second major surface to produce a backside metallized contact suitable for subsequent mounting of the dice.

9. The method of claim 4, wherein the wafer of semiconductor material comprises gallium arsenide and the step of reactive ion etching involves using a chlorine based plasma.

10. The method of claim 7, wherein the wafer of semiconductor material comprises gallium arsenide and the isotropic etch solution comprises $H_2SO_4:H_2O_2:H_2O$ in respective portions of 3:1:1.

11. The method of claim 8, wherein the step of defining a second patterned mask on the second major surface utilizes infrared alignment of the second patterned mask to the lanes etched into the first major surface.

12. The method of claim 9, wherein the chlorine based plasma comprises $SiCl_4$.

* * * * *